United States Patent
Hwa et al.

(10) Patent No.: US 7,187,075 B1
(45) Date of Patent: Mar. 6, 2007

(54) STRESS RELIEVING FILM FOR SEMICONDUCTOR PACKAGES

(75) Inventors: Tan Eng Hwa, Melaka (MY); Lim Peng Soon, Melaka (MY); Santhiran S/O Nadarajah, Melaka (MY); Ong Sze Yan, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 76 days.

(21) Appl. No.: 10/903,680

(22) Filed: Jul. 29, 2004

(51) Int. Cl.
*H01L 21/10* (2006.01)

(52) U.S. Cl. .................. 257/707; 257/706; 257/796

(58) Field of Classification Search ............ 257/707
See application file for complete search history.

(56) References Cited

U.S. PATENT DOCUMENTS

| | | | | |
|---|---|---|---|---|
| 4,511,483 A | * | 4/1985 | Ogawa et al. | ......... 252/62.9 R |
| 5,256,564 A | * | 10/1993 | Narita | ................. 438/669 |
| 6,225,703 B1 | * | 5/2001 | Umehara et al. | ........... 257/787 |
| 6,744,133 B2 | * | 6/2004 | Tanabe et al. | ............. 257/707 |
| 2003/0012882 A1 | * | 1/2003 | Tokuhisa et al. | ........ 427/385.5 |
| 2005/0246879 A1 | * | 11/2005 | Kamimura et al. | ........ 29/403.3 |

* cited by examiner

*Primary Examiner*—Andy Huynh
*Assistant Examiner*—Long Tran
(74) *Attorney, Agent, or Firm*—Beyer Weaver LLP

(57) ABSTRACT

Techniques for reducing the mechanical stress imposed upon semiconductor dice by protective molding compounds during times of temperature fluctuation. A thermoplastic material is attached to a top surface of a die to relieve the stress. The thermoplastic material serves as a cushion between the die and the molding compound when the components expand and contract. The thermoplastic material can be shaped such that it does not cover bond pads on the surface of a die.

21 Claims, 3 Drawing Sheets

STRESS RELIEVING FILM FOR SEMICONDUCTOR PACKAGES

FIELD OF THE INVENTION

The present invention relates generally to packaged semiconductor devices, and more specifically to stress relief techniques for semiconductor packaged devices.

BACKGROUND

Semiconductor dice, i.e., integrated circuit chips, are commonly packaged within a protective molding compound, such as plastic or epoxy. The semiconductor dice are thereby given a "packaged" structural form that is more easily handled. The molding compound also provides physical and environmental protection to the semiconductor dice. The protective molding compound is typically formed about a die through a transfer molding process where the die is immersed in a hot, liquid form of the molding compound.

After the transfer molding process, the packaged semiconductor device is allowed to cool down so that the molding compound can solidify. The molding compound lowers in temperature and shrinks in size during the cooling process. Unfortunately, the molding compound and the die usually have differing coefficients of thermal expansion and modulus of elasticity. Therefore, the compound and the die will shrink to different extents. As a result, the die will absorb stress and become compressed and deformed by the compound, which causes micro changes in the surface area of the die. Due to the tight requirements on product performance, e.g. output voltage and resistivity, the micro change in the surface area of the die actually alters the product performance such that the performance falls below an acceptable level. Specifically, the change in the size of a resistive area of an integrated circuit can change the desired resistance or output voltage. Also, it is common that the die attach pad, which supports the die, also has a unique coefficient of thermal expansion. As a result, the molding compound and the die attach pad can act together to deform the die.

The differing reactions to heat are also problematic during normal operation of the packaged semiconductor devices since the heat created by the die causes expansion and contraction of the various packaged semiconductor device components. In many cases, the molding compound is formed of a thermoset resin that does not flex when subjected to changing temperatures. Unfortunately, a molding compound that does not flex causes the electrical components within to be subject to an even larger amount of stress.

One current solution involves adjusting the composition of the molding compound. For example, filler material can be added into the molding compound to affect the amount that the compound expands and contracts. The filler material can be formed of silica, which does not have an elastic nature, as it is a brittle material like glass and therefore unable to be bend or deform when in solid form. The size and amount of the silica filler material can be adjusted accordingly. Unfortunately, these solutions only have a limited extent of effectiveness in reducing the stress imposed upon integrated circuit dice. Also, the inhomogeneous nature of the silica distribution within a molding compound induces large variations in a die's electrical performance.

In view of the foregoing, there are continuing efforts to provide improved techniques for reducing stresses imposed upon integrated circuit dice within packaged semiconductor devices.

BRIEF SUMMARY OF THE INVENTION

The present invention is directed towards reducing the mechanical stress imposed upon semiconductor dice by protective molding compounds during times of temperature fluctuation. A thermoplastic material is attached to a top surface of a die to relieve the stress since it is relatively soft at elevated temperatures. Therefore, the thermoplastic material serves as a cushion between the die and the molding compound when the components expand and contract. Such temperature fluctuations can occur, for example, during transfer molding processes and during operation of the die. The thermoplastic material can be shaped such that it does not cover bond pads on the surface of a die.

As an apparatus, one embodiment of the present invention includes at least a semiconductor die having a top surface, a molding compound that encapsulates the semiconductor die, and a piece of thermoplastic material positioned on the top surface of a semiconductor die such that the piece of thermoplastic material is positioned between the top surface of the semiconductor die and the molding compound, the thermoplastic material being suitable for absorbing stress imposed by thermal expansion and contraction of the die and the molding compound.

As an apparatus, an alternative embodiment of the present invention includes at least a semiconductor die having a top surface, the semiconductor die having a first modulus of elasticity, a molding compound that encapsulates the semiconductor die, and a stress absorbing sheet positioned on the top surface of a semiconductor die such that the stress absorbing sheet is positioned between the top surface of the semiconductor die and the molding compound, the stress absorbing sheet having a second modulus of elasticity that is less than that of the first modulus of elasticity, the stress absorbing sheet being suitable for absorbing stress imposed by thermal expansion and contraction of the die and the molding compound.

As a method, one embodiment of the present invention includes at least cutting a piece of thermoplastic material from a thermoplastic sheet, wherein the thermoplastic material is relatively hard at an ambient temperature, attaching the piece of thermoplastic material onto a top surface of a semiconductor die, surrounding the semiconductor die and the piece of thermoplastic with a liquid molding compound that is at a raised temperature in order to form the packaged semiconductor device, wherein the raised temperature of the liquid molding compound causes the piece of thermoplastic material to soften, and cooling the liquid molding compound such that is shrinks and changes into a solid molding cap, wherein the piece of thermoplastic is compressed and thereby absorbs stress caused by the molding cap.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to reducing the mechanical stress imposed upon semiconductor dice by protective molding compounds during times of temperature fluctuation. A thermoplastic material is attached to a top surface of a die to relieve the stress since it is relatively soft at elevated temperatures. Therefore, the thermoplastic material serves as a cushion between the die and the molding compound when the components expand and contract. Such temperature fluctuations can occur, for example, during transfer molding processes or during operation of the die. The thermoplastic material is also easy to work with since it can be easily shaped in its relatively hard state at ambient temperatures. The thermoplastic material can be shaped such that it does not cover bond pads on the surface of a die.

Figure 1:
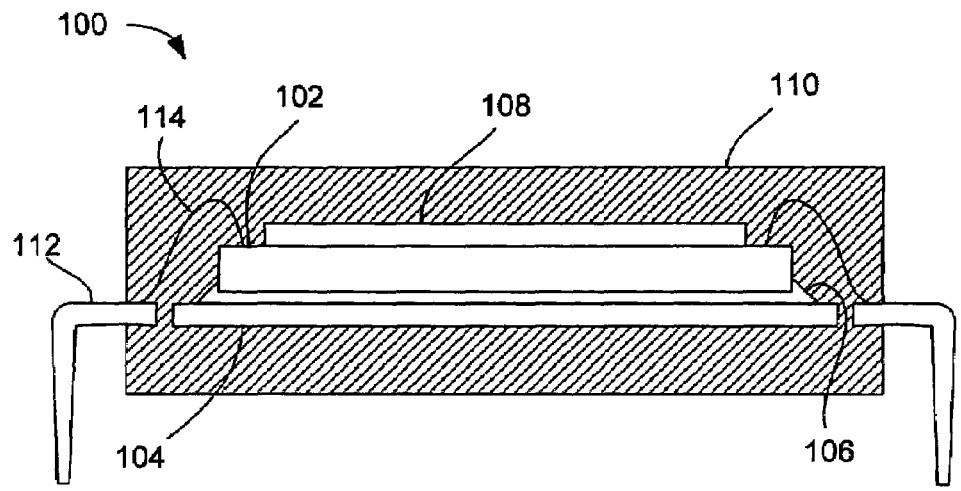
FIG. 1 illustrates a top plan and cross-sectional view of a packaged semiconductor device according to one embodiment of the present invention.
Figure 2:
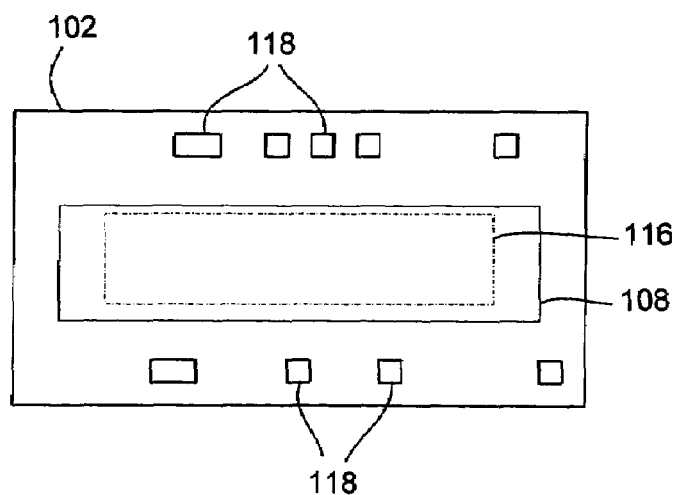
FIG. 2 illustrates a top plan view of the die and thermoplastic material of FIG. 1.

FIG. 1 illustrates a top plan and cross-sectional view of a packaged semiconductor device 100 according to one embodiment of the present invention. Device 100 includes a semiconductor die 102 that is attached to a die attach pad 104 by an adhesive material 106, a thermoplastic material 108, and a molding cap 110. Device 100 also includes connector legs 112 and interconnecting wires 114, which connect legs 112 to die 102. FIG. 2 illustrates a top plan view of die 102 and thermoplastic material 108 of FIG. 1.

Semiconductor die 102 is a piece of semiconductor material, such as silicon, that has been fabricated to include integrated circuits. Many of the integrated circuits happen to be on the top (or active) surface of the die 102. These integrated circuits are very small in scale and therefore their performance can be adversely affected by any change in size or shape of die 102. Changes in size or shape of die 102 include bending, compression, or expansion, of the entire die 102 or just a portion of die 102. A particularly sensitive area of die 102 would be the top surface since many integrated circuits are located near or on the top surface. Changes in size or shape of the sensitive areas of die 102 can cause changes in the electrical characteristics of the integrated circuits. For example, the resistivity, output voltages, frequency, and noise level can be affected. Such changes can cause the performance of die 102 to suffer to the point of failure.

The top plan view of FIG. 2 shows a sensitive area 116 of die 102 outlined in a dashed line. As discussed above, sensitive area 116 can represent the area of die 102 that contains integrated circuits. The top surface of die 102 also contains bond pads 118, which serve as the input and output terminals of die 102. Interconnecting wires 114 are attached to bond pads 118 and to legs 112 in order to connect die 102 to other electrical systems.

Die 102 is typically flat and rectangular in shape, however they can be cut from a semiconductor wafer in various shapes, if desired.

Die attach pad 104 is particularly useful for supporting die 102 during the manufacturing process. Die attach pad 104 can be formed from a conductive material such as copper. Adhesive 106 secures die 102 to die attach pad 104. Adhesive 106 can be for example, an epoxy adhesive. Interconnecting wires 114 are typically made of either gold or aluminum but can be formed of various conductive materials.

Molding cap 110 is formed of a protective material such as epoxy resin, biphenyl resin or multi-function resin plastic materials. Molding cap 110 is typically formed through a molding process where a liquid form of the protective material flows into a molding chamber, encapsulates the components of device 100, and then is allowed to cool and harden. Cap 110 then provides mechanical and environmental protection for die 102. However, as cap 110 cools, it also shrinks and applies pressure onto die 102. In some instances, molding cap 110 is formed of a thermoset material, which becomes stiff to the extent that it does not expand or contract noticeably after it has cooled and hardened.

The stress relieving aspect of device 100 is provided through thermoplastic material 108. Thermoplastic material 108 typically is relatively stiff at lower temperatures and softer at higher temperatures. In some embodiments, the lower temperatures include ambient temperatures at which manufacturing processes take place. For example, some thermoplastic materials are rather stiff at normal ambient temperatures (e.g., room temperature) and can thereby be easily handled, shaped, and/or cut into a desired shape for application onto die 102. However, at elevated temperatures, thermoplastic material 108 becomes softer and thereby can absorb stresses that would otherwise be imposed by molding cap 110 onto die 102. Specifically, after a transfer molding process, the molding material is in a hot and liquid form that needs to be cooled down. The hot molding material softens thermoplastic material 108 and then starts to shrink. Instead of shrinking and applying pressure onto die 102, the molding material now applies pressure onto and squeezes thermoplastic material 108. Since thermoplastic material 108 is relatively soft, it absorbs the stress so that die 102 doesn't have to.

After the molding material hardens into form, the semiconductor device 100 can be put to use. During use, die 102 generates heat and causes the various components of the device to heat up and expand. As discussed, each of the components is likely to have a different coefficient of thermal expansion thereby causing, for example, die 102 to expand at a faster rate than the surrounding molding cap 110. Typically, molding cap 110 is made of a thermoset material, which does not noticeable change in size or shape after it has cooled and hardened. This would increase the amount of stress felt by die 102 since molding cap 110 does not give way to die 102. Fortunately, thermoplastic material 108 softens due to the heat generated by die 102 and is then able to absorb the stress imposed by the expanding die 102. Essentially, thermoplastic material 108 provides a cushion between die 102 and molding cap 110 to allow die 102 to freely undergo some expansion and contraction without causing harm to the sensitive areas of die 102. Without thermoplastic material 108, die 102 would crowd against the adjacent surface of molding cap 110, absorb stress on its outer surfaces and then undergo some strain. The die can even be strained to the point that the shape of die 102 changes through bending.

As seen in the top plan view of FIG. 2, thermoplastic material 108 is shaped for placement onto the top surface of die 102 to cover sensitive areas, such as area 116, without covering bond pads 118 so that die 102 can still be wire bonded to connectors such as legs 112. Thermoplastic material 108 is advantageous since it is relatively hard at most ambient temperatures. Therefore, it can be easily shaped for use. For example, thermoplastic material 108 can be shaped through techniques such as, but not limited to, cutting and stamping. Cutting of the thermoplastic material can be performed, for example, with a saw blade. As in FIG. 2, thermoplastic material 108 is shaped into a rectangular shape and does not cover any of bonding pads 118.

In addition to its behavior with respect to temperature, thermoplastic material is also an appropriate material to use within packaged semiconductor devices since it does not outgas.

Figure 3:
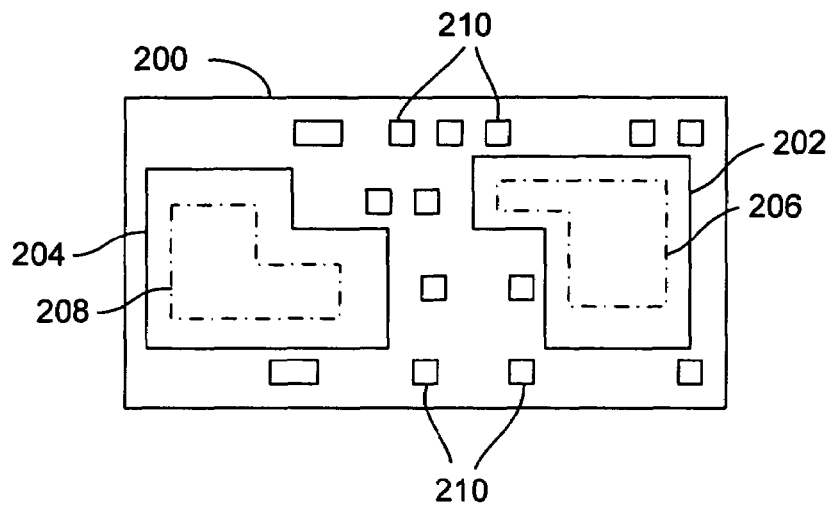
FIG. 3 illustrates a semiconductor die having attached pieces of thermoplastic material according to a different embodiment of the invention.

FIG. 3 illustrates a semiconductor die 200 having attached pieces of thermoplastic material 202 and 204 according to a different embodiment of the invention. Thermoplastic material pieces 202 and 204 are shaped into specific shapes appropriate for covering sensitive areas 206 and 208 and for leaving bonding pads 210 exposed. The shape of thermoplastic material pieces 202 and 204 can vary depending upon the specific semiconductor die. Factors affecting the shape of the thermoplastic pieces include the size and shape of the die, the size and shape of the sensitive areas to be protected from stress, and the location of the bonding pads. The outline shape of the thermoplastic pieces 202 and 204 can have straight edges or curved edges.

As seen in FIG. 3, multiple pieces of thermoplastic material 202 and 204 can be used to cover a single die 200. This can be useful in cases where the sensitive areas of a die are more easily covered by multiple pieces of thermoplastic material rather than a single piece. Multiple pieces can be easier to use due to the location of bond pads upon a die.

In some embodiments, the thermoplastic material pieces can be shaped to cover an entire top surface of a semiconductor die. Such pieces should have openings formed through cutting, stamping, or other procedures to expose the underlying bond pads. It may be the case that in such embodiments, a semiconductor die can have sensitive areas that cover most of the top surface of the die.

The size of the thermoplastic materials should be at least as large as the sensitive areas being protected. As shown in FIGS. 1 and 2, to the extent allowed by surrounding bonding pads, the thermoplastic material can be shaped and sized slightly larger than the sensitive areas so that the material can be positioned onto a semiconductor die with a larger tolerance for the process of positioning the thermoplastic material onto the die.

In an alternative embodiment, thermoplastic material pieces can be attached to the side surfaces of a semiconductor die. In these embodiments, the thermoplastic material can protect the side surfaces of the die from stress related to the thermal incompatibility of the die and a surrounding molding cap.

The amount of stress absorbed by thermoplastic material 108 depends upon the size, shape, the particular type of thermoplastic material, and the thickness of the material. For example, the thickness of the thermoplastic material should be sufficient thick to relieve stress from a semiconductor die such that the performance of the die is not adversely affected by stresses imposed by a surrounding molding material. The thickness of thermoplastic material pieces used in the present invention can range between approximately 0.5 mil to 3 mils. However, the thickness of the thermoplastic pieces can vary beyond this range as the specific characteristics of packaged semiconductor devices can range widely. Designing the thickness of a piece of thermoplastic material that is excessively thick is not desirable in many cases because of requirements to maintain a small form factor for packaged semiconductor devices. Minimizing the overall size and shape of thermoplastic material pieces is also desirable in many cases to minimize costs.

The transition temperature of the thermoplastic material determines when it starts to soften drastically. Therefore, a thermoplastic material should be selected so that its transition temperature is in the range of the temperatures experienced by the packaged semiconductor device during manufacturing processes and during operation. In this way, the thermoplastic material will effectively soften and relieve stress from the semiconductor die. To properly relieve stress from the semiconductor die, the thermoplastic material should soften to the point that its modulus of elasticity is less than the modulus of elasticity of the molding compound. In the softened state, the thermoplastic material can cushion the die from stress caused by the thermal incompatibility between the die and the surrounding molding cap.

In alternative embodiments, materials other than thermoplastic materials can substitute for the thermoplastic material if their modulus of elasticity is also approximately equal to or less than that of the molding compound. These materials can also relieve stress experience by the die due to the thermal incompatibility with the molding cap.

Figure 4:
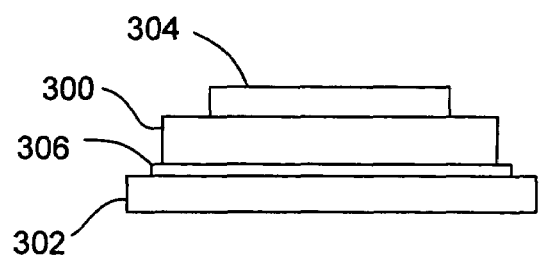
FIG. 4 illustrates a partially assembled semiconductor device package according to an alternative embodiment of the present invention.

FIG. 4 illustrates a partially assembled semiconductor device package according to an alternative embodiment of the present invention. The components shown include a semiconductor die 300, a die attach pad 302, a top layer of thermoplastic material 304, and a bottom layer of thermoplastic material 306. In order to focus the explanation of this embodiment on the aspects relevant to the invention, the surrounding molding cap, connector legs, and interconnecting wires are not shown or discussed. Die 300 is attached to die attach pad 302 through the bottom layer of thermoplastic material 302 rather than with an adhesive material such as epoxy. As discussed above, the top layer of thermoplastic material 304 functions to relieve stress imposed upon the top surface of die 300.

The bottom layer of thermoplastic material 302 functions to relieve stress that may be imposed upon the bottom surface of die 300 by die attach pad 302. The bottom layer of thermoplastic material 306 is useful since in some packaged semiconductor devices, the coefficient of thermal expansion for the die attach pad 302 and die 300 can differ to the extent that the respective components will expand and contract at different rates so that the die attach pad 302 can cause bending of die 300. This is even more likely in the cases where the thermal effects upon each of die 300, die attach pad 302, and the molding compound are different. The top and bottom thermoplastic layers 304 and 306, respectively, act together to relive stress from die 300 imposed by a molding cap and die attach pad 302.

The thickness of bottom layer of thermoplastic material 306 is determined based upon the amount of stress to be relieved from die 300. Bottom layer of thermoplastic material 306 can include an adhesive substance in order to be secured to each of die attach pad 302 and die 300.

Figure 5:
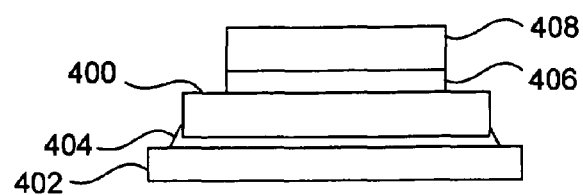
FIG. 5 illustrates a partially assembled semiconductor device package according to yet another alternative embodiment of the present invention.

FIG. 5 illustrates a partially assembled semiconductor device package according to yet another alternative embodiment of the present invention. The components shown include a semiconductor die 400, which is attached to a die attach pad 402 with an adhesive material 404, a layer of thermoplastic material 406, and a supplementary stress absorbing structure 408. As described above, thermoplastic material 406 relieves stress from die 400. In this embodiment, supplementary stress absorbing structure 408 absorbs an additional amount of stress caused by the thermal incompatibilities of die 400 and a surrounding molding cap. Supplementary stress absorbing structure 408 can be formed of various materials such as a semiconductor material (e.g., silicon). A supplementary stress absorbing structure 408, such as a piece of silicon, can also help minimize the variation in the amount of stress imposed by a surrounding molding cap upon the layer of thermoplastic material 406. This is especially useful when the molding cap contains, as it usually does, irregularly shaped silica filler material. The areas within a molding cap that contain silica filler material can impose higher levels of stress upon the layer of thermoplastic material 406 in a non-uniform manner. Supplementary stress absorbing structure 408 allows the layer of thermoplastic material 406 to more effectively relieve stress from die 400 by allowing the layer of thermoplastic material 406 to absorb a more uniform distribution of stress.

In some embodiments, supplementary stress relieving structure 408 can also be a thermoplastic material that is of the same or different type than that of thermoplastic material 406. A combination of two different types of thermoplastic material can provide different cost and stress relieving advantages. In yet other embodiments of the invention, more than two layers of thermoplastic materials can be used.

In some embodiments, the supplementary stress relieving structure 408 is useful for providing a desired thickness to the die attach pad 402 and die 400 structural combination.

Processes for attaching thermoplastic material onto a semiconductor die are convenient since the materials can be selected to be in a relatively solid form at the temperatures at which they are worked with. Therefore, as discussed above, the thermoplastic material can be worked with in sheet form and be shaped into the desired shapes for placement onto a die in a variety of manners (e.g., cutting, stamping, etc.). Each of the shaped pieces of thermoplastic material can then be attached to each die in a variety of manners. For example, the pieces of thermoplastic material can be picked-and-placed onto the die.

The shaped pieces of thermoplastic material can be secured to each die in a variety of manners also. For example, a separate adhesive agent can be used. In other embodiments, the thermoplastic material can be supplied in a form such that it has a pre-applied adhesive agent on one of its surfaces. The thermoplastic materials can also be applied using heat and by mechanically pressing the material onto the die. Yet in other embodiments, an adhesive is not required since each piece of thermoplastic material can be sufficiently secured to a die through electrostatic energy.

Figure 6:
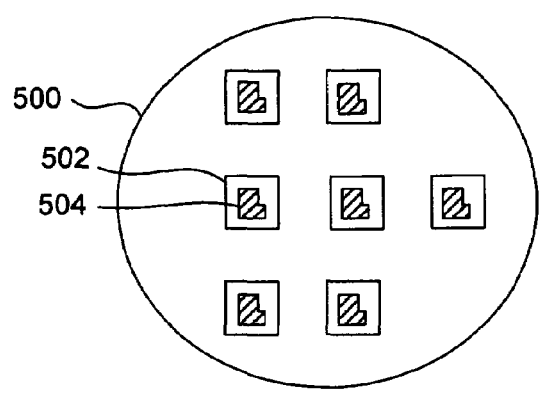
FIG. 6 diagrammatically shows a semiconductor wafer, which contains a matrix of semiconductor dice wherein each die has a piece of thermoplastic material attached upon its top surface.
Figure 7:
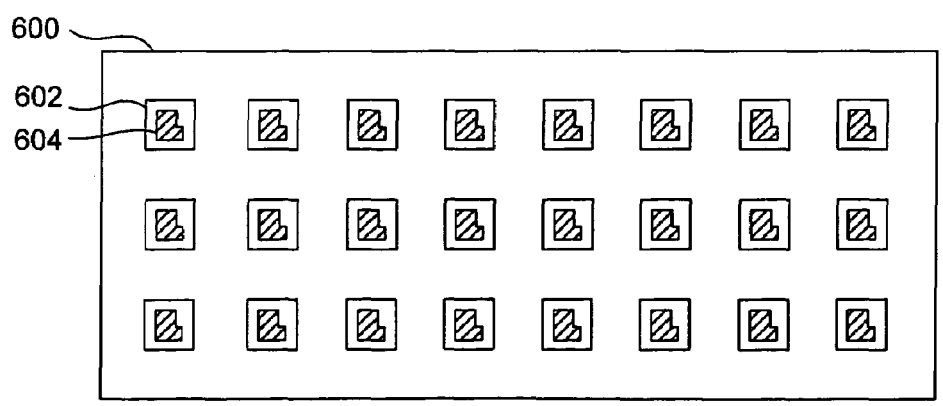
FIG. 7 diagrammatically shows a conductive leadframe, upon which have been attached multiple dice wherein each of die has a piece of thermoplastic material attached upon its surface.

FIGS. 6 and 7 illustrate two different layouts of semiconductor dice within which thermoplastic materials can be applied to each semiconductor die. FIG. 6 illustrates that thermoplastic materials can be applied to semiconductor dice when the dice are in wafer form. And FIG. 7 illustrates that thermoplastic materials can be applied to semiconductor dice when the dice are mounted onto a conductive leadframe.

FIG. 6 diagrammatically shows a semiconductor wafer 500, which contains a matrix of semiconductor dice 502. Each die 502 has a piece of thermoplastic material 504 attached upon its top surface. As is commonly known, semiconductor materials are typically fabricated in wafer form to include multiple die with integrated circuits. Pre-shaped pieces of thermoplastic material 504 can be attached to dice 502 that are still within a substrate, such as wafer 500. After the pieces of thermoplastic material 504 are attached to dice 502 and other wafer-based manufacturing processes are completed, wafer 500 will be singulated into individual dice 502.

FIG. 7 diagrammatically shows a conductive leadframe 600, upon which have been attached multiple dice 602. Each of die 602 has a piece of thermoplastic material 604 attached upon its surface. Leadframe 600 represents a common apparatus used in the process for forming a packaged semiconductor device. Leadframe 600 includes an array of device areas, which typically includes a die attach pad and connector legs. After dice 602 are attached to respective die attach pads, thermoplastic material pieces 604 are attached to each of the dice 602, and other processing operations are completed, then each device area is singulated to produce a packaged semiconductor device. The other processing operations include forming a protective molding cap over the semiconductor dice. Note that some leadframe embodiments do not utilize a die attach pad such that the resulting packaged device does not contain a die attach pad. A die attach pad is not necessary when, for example, a contact tape material is used to temporarily support dice 602 during the manufacturing process.

FIGS. 6 and 7 illustrate two stages during which thermoplastic material can be applied to semiconductor die. However, it should be noted that pieces of thermoplastic material can be placed onto individual semiconductor die in various stages of packaging operations.

The stress absorbing thermoplastic material of the present invention can be used in various types of semiconductor device packages in which the die requires protection from stress. For example, the present invention can be utilized in various types of molded semiconductor device package types such as leadless leadframe packages, ball grid array packages, quad-flat packs, dual in-line packages, and the like.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor device comprising:
  a semiconductor die having a top surface;
  a molding compound that encapsulates the semiconductor die; and
  a piece of thermoplastic material positioned on the top surface of the semiconductor die such that the piece of thermoplastic material is positioned between the top surface of the semiconductor die and the molding compound, the thermoplastic material being suitable for absorbing stress imposed by thermal expansion and contraction of the die and the molding compound, wherein the piece of thermoplastic material has a transition temperature in a range of temperatures experienced by the semiconductor device during operation of the semiconductor device, whereby when heat generated by the die during operation of the die heats the thermoplastic material to at least the transition temperature of the thermoplastic material, the thermoplastic material will soften to cushion the die from stress caused by thermal incompatibility between the die and the molding compound.

2. A semiconductor device as recited in claim 1 wherein the piece of thermoplastic material is in the form of a sheet.

3. A semiconductor device as recited in claim 1 wherein the thermoplastic material softens when its temperature rises.

4. A semiconductor device as recited in claim 1 wherein the top surface of the semiconductor die has a plurality of bond pads and wherein the piece of thermoplastic material has an outline shape such that the piece of thermoplastic material does not cover any of the bond pads.

5. A semiconductor device as recited in claim 1 wherein the top surface of the semiconductor die contains a plurality of integrated circuits and wherein the piece of thermoplastic material covers at least the plurality of integrated circuits.

6. A semiconductor device as recited in claim 1 wherein the semiconductor die and the molding compound have different coefficients of thermal expansion such that the semiconductor die and the molding compound expand and contract with temperature at different rates.

7. A semiconductor device as recited in claim 1 further comprising:
a supplementary stress absorbing structure attached on top of the piece of thermoplastic material that also absorbs stress imposed by thermal expansion and contraction of the die and the molding compound.

8. A semiconductor device as recited in claim 7 wherein the supplementary stress absorbing structure is formed of silicon.

9. A semiconductor device as recited in claim 7 wherein the supplementary stress absorbing structure has a modulus of elasticity that is higher than a modulus of elasticity for the piece of thermoplastic material.

10. A semiconductor device as recited in claim 1 wherein the semiconductor die has a bottom surface, the semiconductor device further comprising:
a die attach pad that is attached to the bottom surface of the semiconductor die.

11. A semiconductor device as recited in claim 10 wherein the die attach pad is attached to the semiconductor die via a second layer of thermoplastic material.

12. A semiconductor device as recited in claim 1 wherein there are two separate pieces of thermoplastic material positioned on the top surface of the semiconductor die.

13. A semiconductor device as recited in claim 1 wherein a modulus of elasticity of the piece of thermoplastic material is less than a modulus of elasticity of the molding compound when the thermoplastic material is heated to at least the transition temperature of the thermoplastic material.

14. A semiconductor device as recited in claim 1 wherein the thickness of the thermoplastic material is in the range of approximately 0.5 to 3 mils.

15. A semiconductor device comprising:
a semiconductor die having a top surface;
a molding compound that encapsulates the semiconductor die; and
a stress absorbing sheet positioned on the top surface of the semiconductor die such that the stress absorbing sheet is positioned between the top surface of the semiconductor die and the molding compound, the stress absorbing sheet being suitable for absorbing stress imposed by thermal expansion and contraction of the die and the molding compound, wherein the stress absorbing sheet has a transition temperature in a range of temperatures experienced by the semiconductor device during operation of the semiconductor device, whereby when heat generated by the die during operation of the die heats the stress absorbing sheet to at least the transition temperature of the stress absorbing sheet, the stress absorbing sheet will soften to cushion the die from stress caused by thermal incompatibility between the die and the molding compound.

16. A semiconductor device as recited in claim 15 wherein the top surface of the semiconductor die has a plurality of bond pads and wherein the stress absorbing sheet has an outline shape such that the stress absorbing sheet does not cover any of the bond pads.

17. A semiconductor device as recited in claim 16 wherein the top surface of the semiconductor die contains a plurality of integrated circuits and wherein the stress absorbing sheet covers at least the plurality of integrated circuits.

18. A semiconductor device as recited in claim 15 wherein the stress absorbing sheet softens when its temperature rises.

19. A semiconductor device as recited in claim 15 wherein there are two separate stress absorbing sheets positioned on the top surface of the semiconductor die.

20. A semiconductor device as recited in claim 15 wherein a modulus of elasticity of the stress absorbing sheet is less than a modulus of elasticity of the molding compound when the stress absorbing sheet is heated to at least the transition temperature of the stress absorbing sheet.

21. A semiconductor device as recited in claim 15 wherein the thickness of the stress absorbing sheet is in the range of approximately 0.5 to 3 mils.

* * * * *